United States Patent [19]

Sakai et al.

[11] Patent Number: 5,717,310
[45] Date of Patent: Feb. 10, 1998

[54] POWER SUPPLY CONTROL DEVICE FOR ELECTRIC VEHICLE

[75] Inventors: Kouji Sakai; Hideyuki Jinzai; Shugo Kondo, all of Saitama-ken, Japan

[73] Assignee: Honda Giken Kogyo Kabushiki Kaisha, Tokyo, Japan

[21] Appl. No.: 755,641

[22] Filed: Nov. 25, 1996

[30] Foreign Application Priority Data

Dec. 8, 1995 [JP] Japan .................................. 7-345622

[51] Int. Cl.$^6$ .................................. H01M 10/46
[52] U.S. Cl. .................................. 320/15; 320/30; 320/43; 320/48
[58] Field of Search .................................. 320/6, 10, 11, 320/12, 14, 15, 16, 17, 27, 29, 30, 39, 56, 48, 43

[56] References Cited

U.S. PATENT DOCUMENTS

| | | | |
|---|---|---|---|
| 3,686,549 | 8/1972 | Winebrener | 318/139 |
| 5,309,073 | 5/1994 | Kaneko et al. | 318/500 |
| 5,350,994 | 9/1994 | Kinoshita et al. | 320/15 |
| 5,446,365 | 8/1995 | Nomura et al. | 320/15 X |
| 5,488,283 | 1/1996 | Dougherty et al. | 320/15 |
| 5,523,670 | 6/1996 | Ninomiya | 320/14 |

Primary Examiner—Edward Tso
Attorney, Agent, or Firm—Nikaido, Marmelstein, Murray & Oram LLP

[57] ABSTRACT

A power supply control device for an electric vehicle capable of reducing the power consumption in a battery monitor assembly adapted for monitoring a residual electric charge in a main battery 4. In response to an operation which causes increasing or decreasing the residual charge in the main battery 4, a start-up unit 200 produces a start-up demand pulse P3. Upon receiving the start-up demand pulse P3, a power supply controller circuit 60 closes a switch 59 to allow the power from a sub battery 5 to be supplied the battery monitor assembly 100. When the battery monitor assembly 100 is activated, its power supply maintaining means 102 delivers a self-hold signal S4 to maintain the switch 59 being closed. The battery monitor assembly 100 keeps monitoring the residual charge in the main battery 4 while it is energized by the sub battery 5.

7 Claims, 6 Drawing Sheets

POWER SUPPLY CONTROL DEVICE FOR ELECTRIC VEHICLE

BACKGROUND OF THE INVENTION

1. Field of the Invention

The present invention relates to a power supply control device for an electric vehicle and particularly, to a power supply control device for an electric vehicle capable of decreasing the consumption of power in a battery monitor assembly for monitoring a residual electric charge in a battery (battery state of charge).

2. Description of the Related Art

It is common in an electric vehicle to have a significant difference between the rated voltage (e.g. 288 V) of a drive motor or an air conditioner and the rated voltage (e.g. 12 V) of any other control device such as an electronic control unit (ECU) and a motor controller. For the purpose of compensation, a sub- or low-voltage battery is provided for feeding a lower voltage (12 V) to the control devices in addition to a main or high-voltage battery (288 V) for driving the drive motor. The low-voltage battery is charged with a corresponding voltage output converted by a DC/DC converter from the high-voltage output of the high-voltage battery.

Figure 2:
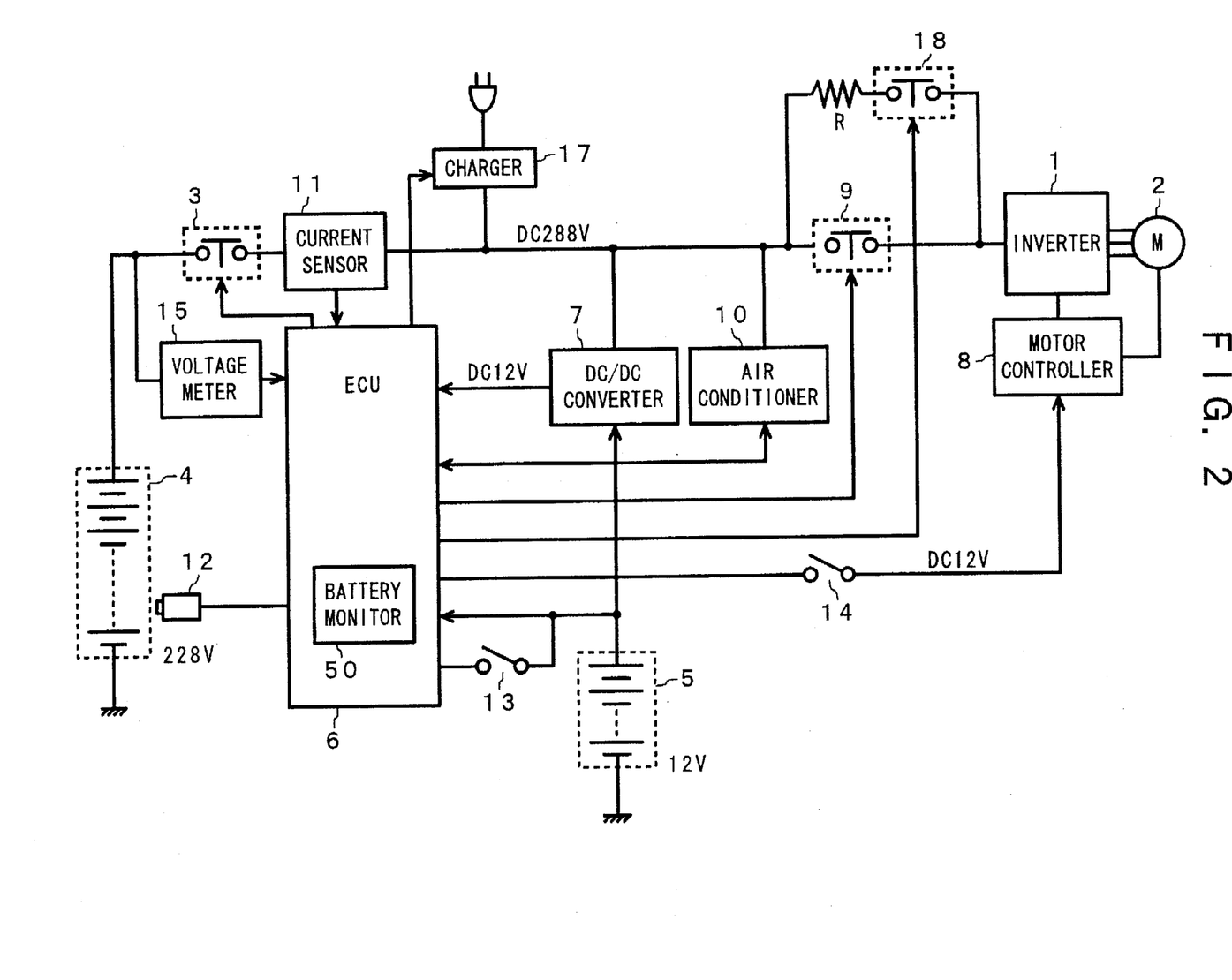
FIG. 2 is a block diagram of a common power supply control circuit for an electric vehicle to which the present invention is preferably applicable.

FIG. 2 is a block diagram showing a primary part of a power supply controller in an electric vehicle, in which a high-voltage battery 4 is connected at its output through a main switch 3 to a DC/DC converter 7 and an air conditioner 10, and further through a motor switch 9 to an inverter 1. The motor switch 9 is also connected in parallel with a resistor R and a precharging switch 18 which are coupled to each other in series. The output of the DC/DC converter 7 is connected to an ECU 6 so that its DC 12 V output is fed via the ECU 6 to both a motor controller 8 and a low-voltage battery 5.

The ECU 6 controls switching actions of the switches 3, 9, and 18, a temperature monitoring action over the high-voltage battery 4 with a thermal sensor 12, a voltage monitoring action with a voltage meter 15, a charge/discharge current monitoring action with a current sensor 11, a start-up monitoring over the air conditioner 10, and state monitoring actions on an ignition (IG) switch 14 and a charge switch 13, and includes a battery monitor 50 for monitoring a residual electric charge in the high-voltage battery 4.

The main switch 3 is switched on and maintained at its closed position by the ECU 6 when it is turned on. The switch 3 is opened to immediately disconnect the power supply of a high voltage to the loads when a fault such as leakage occurs in the high-voltage power system. The motor controller 8 is responsive to detection outputs of an acceleration opening angle sensor and a motor RPM sensor, both not shown, for controlling the inverter 1 to ensure the optimum operation of a motor 2. The high-voltage battery 4 is charged by a charger 17 which is controlled by the ECU 6.

Since the residual charge in the high-voltage battery determines a possible running distance of the electric vehicle, it has to be monitored as correct as possible through measuring or calculating the balance of charged and discharged currents. To this end, the charge and discharge of current are required to be substantially detected by a current sensor or the like during the charging from an external source to the battery and the use of the air conditioner even when the vehicle is parked as well as during the vehicle is driven. Even if none of the air conditioner and other electric auxiliary components remains turned on in a parking of the vehicle, there is more or less a self-discharge from the battery. It is thus needed to monitor the terminal voltage of the battery, preferably periodically, and correct its storage data by considering actual measurements.

The measurement of charged/discharged currents and terminal voltage of the battery, and the calculation of the residual storage in the battery based on the measurements are carried out by the battery monitor 50 in the ECU 6. This causes the ECU 6 to remain activated during the parking of the vehicle when an ignition switch 14 is opened. As the ECU 6 consumes a considerable amount of power, the battery is significantly declined in the residual electric charge particularly during the parking of the vehicle. When the low-voltage battery 5 is used to energize the ECU 6, its small storage of charges will be exhausted within a relatively short period of time causing the electric vehicle not to run.

The ECU 6 may be fed with a 12 volt, down converted supply from the high-voltage battery 4 in the parking of the vehicle. This increases the consumption of charges stored in the high-voltage battery 4 and thus reduces the running distance of the vehicle while the low-voltage battery 5 may remain intact in the parking of the vehicle for a relatively long time and may not be exhausted. Also, when the vehicle is parked without charging the battery 4 for a long duration, the high-voltage battery 4 keeps discharge with very small current to result a deep discharge (or over discharge) hence shortening its length of life.

SUMMARY OF THE INVENTION

It is an object of the present invention to provide a power supply control device for an electric vehicle capable of reducing the power consumption in power of an ECU for monitoring the condition of a battery in order to reduce the consumption of the residual charge in the battery.

A power supply control device for an electric vehicle according to the present invention comprises a battery for feeding a power supply to each component of the electric vehicle, a battery monitoring means for monitoring a residual electric charge in the battery, a power supply controlling means for controlling the power supply to the battery monitoring means, a starting means for producing a start-up demand for activating the power supply controlling means and the power supply controlling means arranged responsive to the start-up demand for maintaining the power supply to the battery monitoring means throughout a predetermined period of time.

The battery monitoring means is selectively energized for monitoring only when one of a plurality predetermined conditions is satisfied, hence reducing the consumption of power required for monitoring the battery storage level and increasing the operational life of the battery and the running distance of the vehicle.

DETAILED DESCRIPTION OF THE PREFERRED EMBODIMENT

Figure 1:
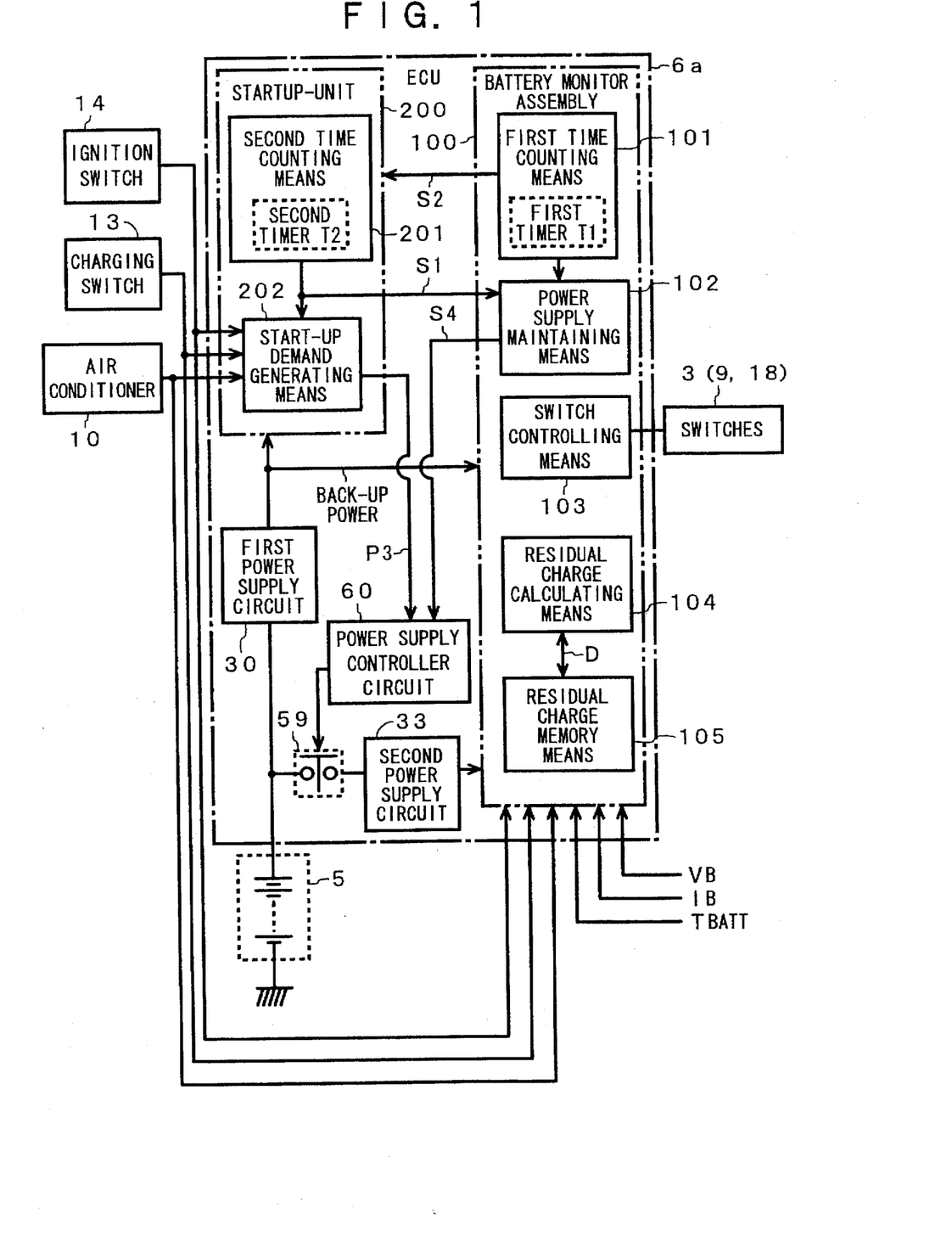
FIG. 1 is a block diagram of an ECU according to one embodiment of the present invention.

The present invention will be described in more details referring to the accompanying drawings. FIG. 1 is a block diagram of an ECU 6a in the preferred embodiment according to the present invention, in which like components are denoted by like numerals as of FIG. 2.

A battery monitor assembly 100 comprises a first time counting means 101 including a first timer T1, a power supply maintaining means 102 for producing a self-hold signal S4, a switch controlling means 103 for controlling the switches 3, 9 and 18, a residual charge calculating means 104 for calculating the residual electric charge in the high-voltage battery 4 by a known manner (for example, using a terminal voltage in no-load duration and a length of parking period), and a residual charge memory means 105 for saving data D of the residual charge in the high-voltage battery 4. A start-up unit 200 includes a second time counting means 201 with a second timer T2 and a start-up demand generating means 202 responsive to an operation which causes increase or decrease of the residual electric charge in the high-voltage battery 4 for producing a start-up demand pulse P3.

The low-voltage battery 5 is connected for supply of a power by a first power supply circuit 31 to the start-up unit 200 and to the battery monitor assembly 100 through a switch 59 controlled by a power supply controller circuit 60 and a second power supply circuit 33. The first power supply circuit 31 supplies the battery monitor assembly 100 with a backup power for the residual charge memory means 105 (as a backup RAM) regardless of a power supply control action of the power supply controller circuit 60.

Contact data from a charging switch 13 and an ignition switch 14 and a start-up data from an air conditioner 10 and or any other electric auxiliary component are fed to both the battery monitor assembly 100 and the start-up unit 200. Also, a high-voltage battery terminal voltage data $V_B$ detected by the voltage meter 15, a charged/discharged current data $I_B$ detected by the current sensor 11, and a temperature data $T_{BATT}$ of the high-voltage battery 4 measured by the thermal sensor 12 are all given to the battery monitor assembly 100.

Figure 3:
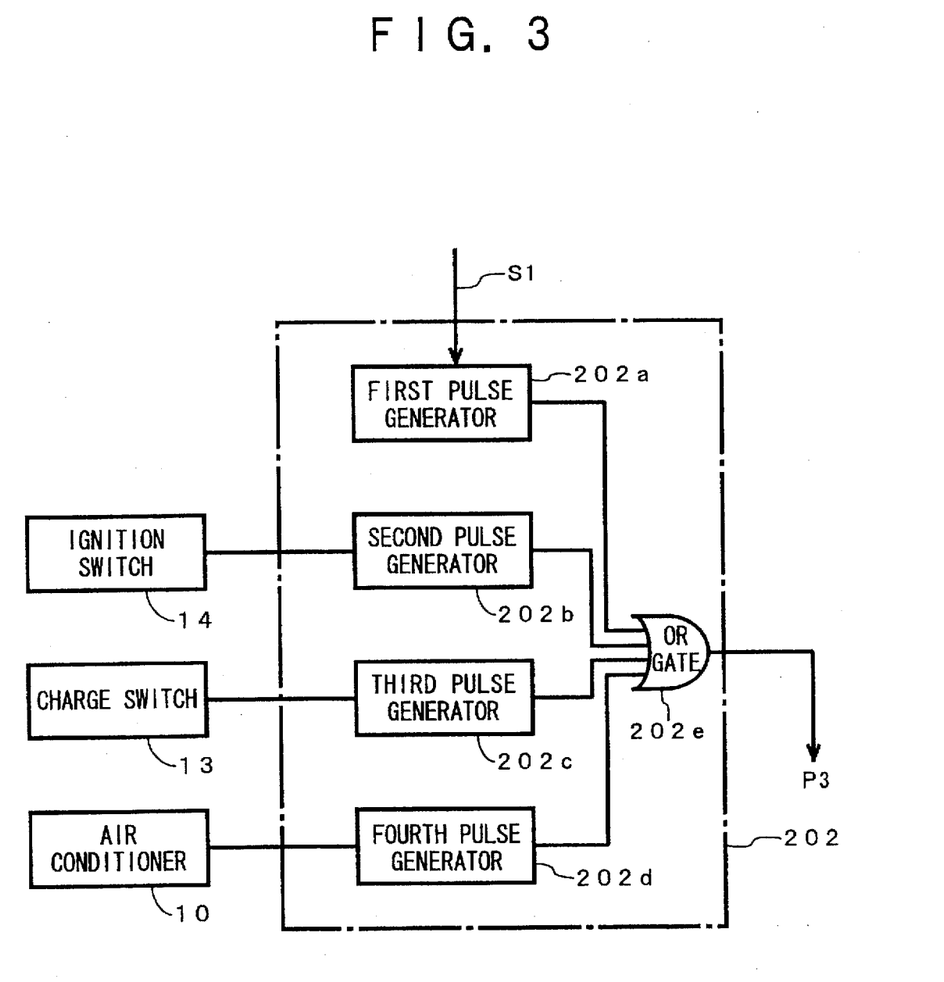
FIG. 3 is a block diagram of a primary part of a start-up demand generating means shown in FIG. 1.
Figure 4A:
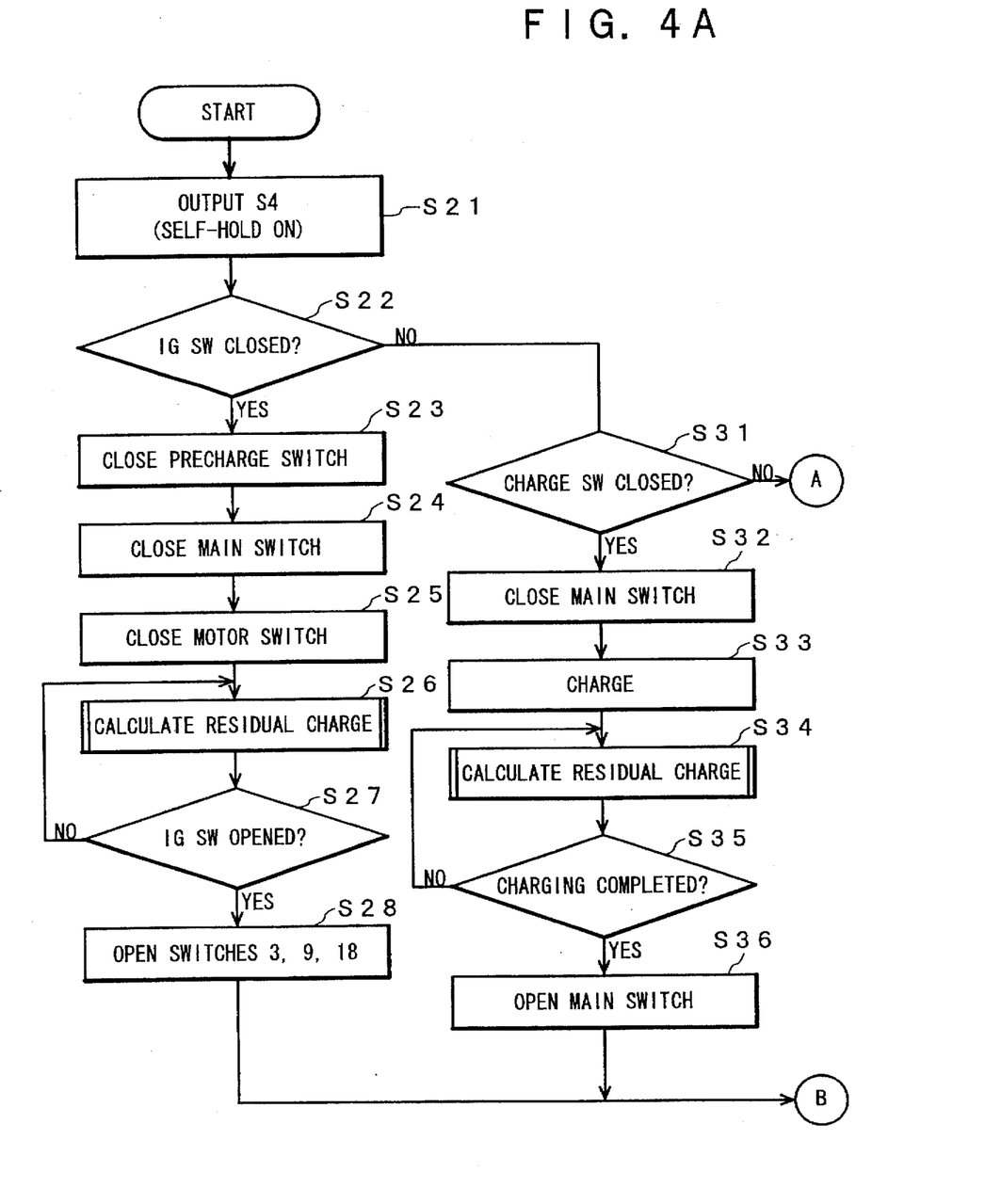
FIGS. 4A and 4B are flowcharts showing a procedure of operations of a battery monitor assembly.
Figure 4B:
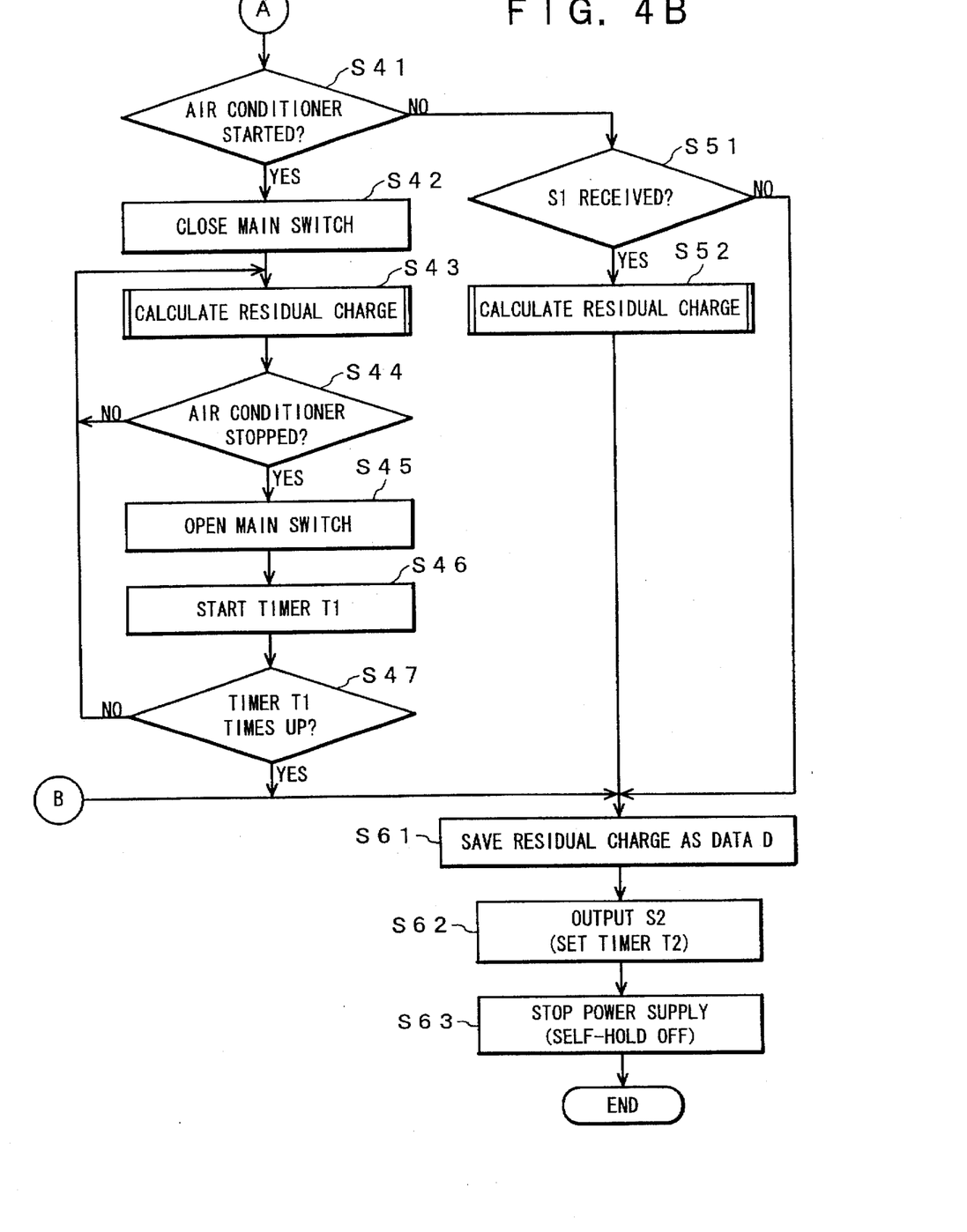
Figure 5:
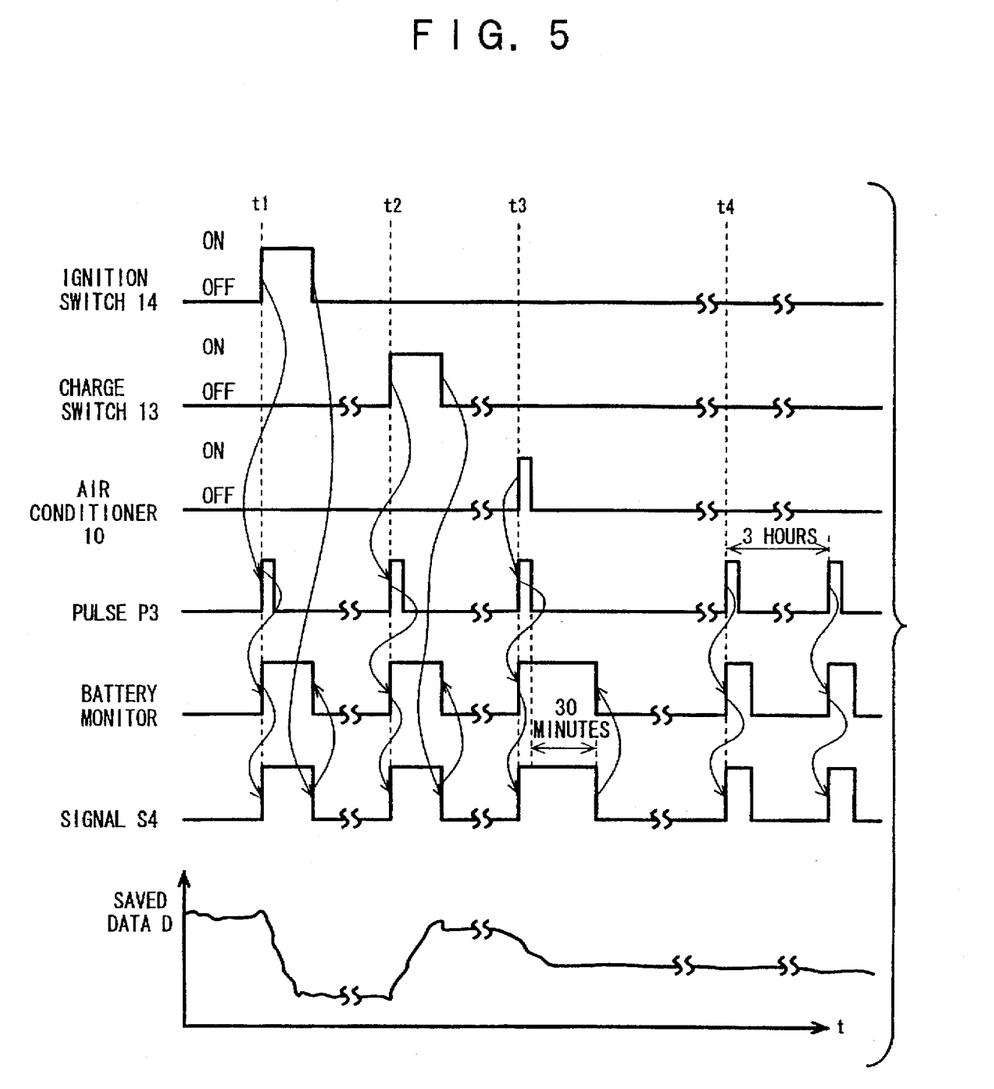
FIG. 5 is a waveform diagram of signals at primary parts illustrated in FIG. 1.

FIG. 3 is a block diagram showing a primary arrangement of the start-up demand generating means 202 in the start-up unit 200. FIGS. 4A and 4B are flowcharts of a procedure of operations in the battery monitor assembly 100. FIG. 5 is a waveform diagram of the prescribed inputs or data and signals.

The start-up demand generating means 202 comprises a first pulse generator 202a for producing a one-shot pulse or first pulse in response to a time-up signal S1 which will be explained later, a second pulse generator 202b responsive to the closing condition of the ignition switch 14 for producing a second pulse signal, a third pulse generator 202c responsive to the closing condition of the charging switch 13 for producing a third pulse signal, a fourth pulse generator 202d responsive to the switching on of the air conditioner 10 for producing a fourth pulse signal, and an OR gate 202e for producing a logic sum of the outputs of the first to fourth pulse generators 202a to 202d. The pulse generators 202a to 202d may be composed of multi-vibrators of one shot type and flip-flops.

In operation, one or more pulse signals are produced by any of the pulse generators 202b to 202d in response to the turning on of the ignition switch 14, the charging switch 13, and the air conditioner 10 (or any other peripheral electric component), each of which may increase or decrease the residual charge in the high-voltage battery 4, and transmitted from the OR gate 202e as start-up demand pulses P3 to the supply controller circuit 60.

Regardless of the operation for increasing or decreasing the residual storage in the high-voltage battery 4, if the time-up signal S1 is produced in response to a time up of the second timer T2 in the second time counting means 201, the first pulse generator 202a again generates the start-up demand pulse P3 which is in turn transmitted to the supply controller circuit 60. The second timer T2 may be set so that it times up upon everytime elapsing a predetermined period (e.g. three hours) for monitoring the high-voltage battery 4 with the vehicle in its parking.

When the ignition switch 14 is closed at the time t1 shown in FIG. 5, the second pulse generator 202b generates and feeds the pulse signal as the start-up demand pulse P3 to the power supply controller circuit 60. Upon receiving the start-up demand pulse P3, the power supply controller circuit 60 closes the switch 59 to allow the power supply from the low-voltage battery 5 to the battery monitor assembly 100 which is thus activated. The battery monitor assembly 100 transmits the self-hold signal S4 from its power supply maintaining means 102 to the power supply controller circuit 60 as explained at Step S21 of FIG. 4A. This causes the switch 59 to remain closed even if the start-up demand pulse P3 from the start-up unit 200 is disconnected.

At Step S22, it is examined whether or not the power supply is commenced in response to the switching on of the ignition switch 14. As it is judged now that the switching on of the ignition switch 14 stands, the procedure goes to Step S23 where the precharging switch 18 (FIG. 2) is closed by the switch controlling means 103 for preventing a surge current. This is followed by Step S24 where the main switch 3 is then closed to start precharging to a capacitor (not shown) connected to the input of the inverter 1. At Step S25, the motor switch 9 is closed.

At Step S26, the data D of the residual charge storage in the high-voltage battery 4 is read out from the residual charge memory means 105 and used for calculating a current level of the residual storage by subtracting from the data D a consumption of power (AH) determined on the basis of a discharged current $I_B$ measured by the current sensor 11. Then, it is examined at Step S27 whether or not the ignition switch 14 is switched off. If the switch 14 remains closed, the procedure moves back to Step S26 for repeating the calculation of the data D. When it is judged that the switch 14 is switched off, the procedure advances to Step S28 where the switches 3, 9, and 18 are opened.

At Step S61, the current level of the residual storage is saved as the data D in the storage data memory means 105. This is followed by Step S62 where the start demand signal S2 is delivered to the second timer T2 in the second time counting means 201 of the start-up unit 200. At Step S63, the self-hold signal S4 of the power supply maintaining circuit 102 is disconnected from the power supply controller circuit 60, thus the switch 59 is opened and the power supply to the battery monitor assembly 100 is disconnected to stop its operation.

In case that the charging switch 13 is switched on with the ignition switch 14 being opened as implemented at t2 of FIG. 5, the start-up demand generating means 202 again produces and feeds the start-up demand pulse P3 to the power supply controller circuit 60 to close the switch 59.

This allows again the battery monitor assembly 100 to be activated. As it is judged at Step S31 by the battery monitor assembly 100 that power supply was started in response to the switching on of the charging switch 13, the procedure goes to Step S32 where the switch controlling means 103 closes the main switch 3. The charger 17 then starts charging of the high-voltage battery 4 at Step S33. This is followed by Step S34 where the data D of the residual charge is read out of the storage data memory means 105 and added with a charged amount IB·K(AH) which is a product of a given constant K and the charging current IB measured by the current sensor 11.

At Step S35, it is examined whether or not the battery charging is to be ended on the basis of the charging switch 13 being opened or the high-voltage battery 4 indicating a full level of charge. When it is affirmative, the main switch 3 is opened at Step S36. This is followed by Step S61 where the current level of the residual storage is saved as the data D in the storage data memory means 105, then the procedure goes to Steps S62 and S63 as mentioned above.

Similarly, in case that the air conditioner 10 (or any other electric auxiliary component) is switched on prior to the start of an engine as implemented at t3 of FIG. 5, the start-up demand generating means 202 produces and feeds the start-up demand pulse P3 to the power supply controller circuit 60 to close the switch 59, so that power supply from the low-voltage battery 5 to the battery monitor assembly 100 being started, and the battery monitor assembly 100 is activated. As it is judged at Step S41 that power supply being started in response to the switching on of the air conditioner 10, the procedure goes to Step S42 where the switch controlling means 103 closes the main switch 3. At Step S43, the data D of the residual storage is calculated by a known manner, for example, on the basis of the terminal voltage VB of the high-voltage battery 4. This is followed by Step S44 where it is examined whether the air conditioner 10 is turned off or not. When the air conditioner 10 is found to have been switched off, the procedure goes to Step S45 for opening the main switch 3. The first timer T1 in the first time counting means 101 is then started at Step S46.

At Step S47, it is examined whether the first timer T1 times up or not. If not, the steps S43 to S47 are repeated until the first timer T1 times up. At Step S43, the data D is renewed at each time. When the first timer T1 times up, the procedure advances to Step S61 for saving of the data D given just before the time up. The timer T1 determines a period or duration of time (e.g. 30 minutes) for stabilizing or recovering the terminal voltage VB of the high-voltage battery 4 after a relatively great load such as the air conditioner 10 is disconnected. This allows the data D of the storage to be detected with higher accuracy.

In case that the time-up signal S1 is produced in response to the time up of the second timer T2 in the second time counting means 201 as implemented at t4 of FIG. 5, the start-up demand pulse P3 is delivered to the supply controller circuit 60 to activate the battery monitor assembly 100. When the battery monitor assembly 100 receives the time-up signal S1 at Step S51, it reads out the data D of the residual storage in the high-voltage battery 4 from the storage data memory means 105, at Step S52, to calculate a current residual charge with the terminal voltage VB of the high-voltage battery 4. Then, Steps S61 to S63 follow for saving the current residual charge, generating the signal S2 and quenching the selfhold signal S4.

As set forth above, the present invention allows the battery monitor assembly 100 of the ECU to be selectively energized at a time only when the monitoring of the battery is desired but otherwise maintained for holding the residual storage (charge) data of the battery which consumes a very small amount of current, hence reducing the consumption of energy required for monitoring the battery and elongating the operational duration of the same.

It should be understood that the embodiment in which a residual charge storage of the battery is calculated based on the terminal voltage VB is preferably applicable to a Pb battery. With an Ni or Li battery, the calculation only based on the terminal voltage is not as easy a task. For countermeasure, a rate of self-discharge per unit time of the battery is saved in advance (with a parameter of temperature if necessary) and a current residual storage level D is calculated by subtracting from the data D of the previous storage a self-discharged amount determined on the basis of a combination of the rate of self-discharge per unit time and a duration or an elapsed time after previous measurement of the residual storage data.

What is claimed is:

1. A power supply control device for an electric vehicle comprising:

a battery for supplying power to each component of the electric vehicle;

a battery monitoring means for monitoring the residual electric charge in the battery;

a power supply controlling means for controlling the power supplied to the battery monitoring means;

a starting means for producing a start-up demand for activating the power supply controlling means; and wherein the power supply controlling means is responsive to the start-up demand for starting the power supplied to the battery monitoring means.

2. A power supply control device for an electric vehicle comprising:

a battery for supplying power to each component of the electric vehicle;

a battery monitoring means for monitoring the residual electric charge in the battery;

a power supply controlling means for controlling the power supplied to the battery monitoring means;

a first starting means for producing a start-up demand in response to any condition which causes increasing or decreasing of the residual charge in the battery; and wherein the power supply controlling means is responsive to the start-up demand for starting the power supplied to the battery monitoring means.

3. A power supply control device according to claim 2, wherein the condition which causes increasing or decreasing of the residual charge is switching on of an ignition switch, and the power supply controlling means continues the power supplied to the battery monitoring means until the ignition switch is opened.

4. A power supply control device according to claim 2, wherein the condition which causes increasing or decreasing the residual charge is charging to the battery, and the power supply controlling means continues the power supplied to the battery monitoring means until the charging of the battery is ceased.

5. A power supply control device according to claim 2, wherein the condition which causes increasing or decreasing the residual charge is the switching on of any peripheral electric component, and the power supply controlling means continues the power supplied to the battery monitoring means until a first predetermined period of time has elapsed after the peripheral electric component is turned off.

6. A power supply control device according to claim 2, further comprising:

a time counting means for counting the time during which the electric vehicle is parked; and a second starting means for activating the power supply controlling means whenever the time counting means counts up a second predetermined period of time.

7. A power supply control device according to claim 2, further comprising:

a second battery for supplying power to the battery monitoring means, wherein the second battery is charged by the battery for supplying power to each component of the electric vehicle.

* * * * *